United States Patent
Golovato et al.

[11] Patent Number: 6,143,144
[45] Date of Patent: Nov. 7, 2000

[54] METHOD FOR ETCH RATE ENHANCEMENT BY BACKGROUND OXYGEN CONTROL IN A SOFT ETCH SYSTEM

[75] Inventors: Stephen N. Golovato, Lexington; Johannes Westendorp, Rockport, both of Mass.

[73] Assignee: Tokyo ElectronLimited, Tokyo, Japan

[21] Appl. No.: 09/365,602

[22] Filed: Jul. 30, 1999

[51] Int. Cl.[7] .................................................. C23C 14/34
[52] U.S. Cl. ............................... 204/192.33; 204/192.32; 204/192.35; 204/192.37; 204/298.31; 204/298.32; 204/298.34; 216/67; 216/68; 156/345; 118/723 I
[58] Field of Search ......................... 204/192.32, 192.33, 204/192.35, 192.37, 298.31, 298.32, 298.34; 216/67, 68; 156/345; 118/723 I

[56] References Cited

U.S. PATENT DOCUMENTS

| | | | |
|---|---|---|---|
| 4,704,301 | 11/1987 | Bauer et al. | 204/298.34 |
| 4,979,465 | 12/1990 | Yoshino et al. | 118/717 |
| 5,433,787 | 7/1995 | Suzuki et al. | 118/723 MP |
| 5,453,124 | 9/1995 | Moslehi et al. | 118/715 |
| 5,556,501 | 9/1996 | Collins et al. | 204/298.34 |
| 5,595,606 | 1/1997 | Fujikawa et al. | 118/725 |
| 5,685,941 | 11/1997 | Forster et al. | 204/298.34 |
| 5,716,485 | 2/1998 | Salimian et al. | 156/345 |
| 5,759,360 | 6/1998 | Ngan et al. | 204/192.37 |
| 5,792,272 | 8/1998 | Van Os et al. | 118/723 IR |

FOREIGN PATENT DOCUMENTS

| | | |
|---|---|---|
| 2-234419 | 9/1990 | Japan . |
| 5-152208 | 6/1993 | Japan . |

*Primary Examiner*—Alan Diamond
*Attorney, Agent, or Firm*—Wood, Herron & Evans, LLP

[57] ABSTRACT

The invention for etching a substrate containing an oxide layer reduces activated oxygen within the plasma and maintains a high soft etch rate in a series of subsequent etches. In one aspect of the invention, a second substrate, in the form of a substrate ring, is utilized in the processing chamber and is etched in conjunction with a first substrate being processed. This substrate ring is formed of a material which, when etched, reacts with activated oxygen to form a stable oxygen-containing compound which may be evacuated from the system. In another aspect of the invention, a first power level for inductively coupling energy to the plasma is determined to establish a bias voltage level at the substrate of approximately 100 Volts. A second, lower power level is then determined for producing a bias voltage level at the substrate not significantly higher than 300 Volts. With the range provided by the determined first and second power levels, an etching power level is selected for inductively coupling energy to the plasma in the range of the first and second power levels but closer to the second power level than the first power level to reduce oxygen activated in the plasma. The etching power level is also selected to establish an etch rate of the substrate in the range of approximately 300–500 Å/min. for a semiconductor oxide such as silicon dioxide, and 75–125 Å/min. for a metal oxide, which would be considered a soft etch.

27 Claims, 4 Drawing Sheets

METHOD FOR ETCH RATE ENHANCEMENT BY BACKGROUND OXYGEN CONTROL IN A SOFT ETCH SYSTEM

FIELD OF THE INVENTION

This invention relates generally to plasma etching of a substrate, and particularly to maintaining desirable etch rates when etching oxide layers of a substrate.

BACKGROUND OF THE INVENTION

Gas plasmas are widely used in a variety of integrated circuit (IC) fabrication processes, including plasma etching and plasma deposition applications. Generally, such plasmas are produced within a processing chamber by introducing a low-pressure process gas into the chamber and then directing electrical energy into the chamber for creating an electrical field therein. The electrical field creates energetic electrons within the chamber which ionize individual process gas molecules by transferring kinetic energy through individual electron-molecule collisions. The electrons are accelerated within the electric field in the processing chamber for efficient ionization of the gas molecules, and the ionized molecules of the process gas and free electrons collectively form what is referred to as a plasma or plasma discharge.

There are a variety of different methods for producing a plasma within a processing chamber. For example, a pair of opposing electrodes might be oriented within the chamber to capacitively couple energy to the plasma. Inductive coupling processes are also popular, and are particularly desirable for their capability of producing a high-density plasma. Inductively coupled plasmas are formed generally utilizing a shaped coil or antenna positioned with respect to the process chamber to inductively couple energy into the processing chamber and thus create and sustain a plasma.

For example, in one particular design for an inductively coupled plasma (ICP) system, an inductive coil or antenna is solenoidal in shape and is wound around the outside of the processing chamber to inductively couple RF energy to the plasma through the chamber sidewalls. In such a system, a portion of the processing chamber is fabricated from a dielectric substance, typically quartz or ceramic, through which the inductive energy from the coil may pass. The high-density plasma developed by such a system is particularly suitable for etching a substrate. Various other ICP systems are also known for use in plasma processing, such as systems which utilize flat coils and inductively couple energy to the plasma through a dielectric window in the top of a processing chamber.

As noted, one particular use for an inductively coupled plasma is sputter etching of a substrate. During processing of a substrate in the formation of integrated circuits, sputter etching is a technique that is utilized to remove a layer of undesired material from an exposed surface of a substrate. Such an etching process is referred to as a pre-clean etch. For example, the surface of a silicon substrate might be pre-cleaned with a sputter etch process prior to the deposition of a metal thin film on the surface. The purpose of the etch is to remove the native oxide and other contaminants from the silicon or other conductive surface in order to ensure a low resistance connection to a metal thin film to be deposited thereon. Typically, for a silicon substrate, the upper substrate surface might be predominantly silicon dioxide ($SiO_2$), an insulator, with small holes or vias formed through the upper surface to the silicon or other conducting surface beneath.

Generally, an IC substrate will include multiple material layers which form the conductive and insulative surfaces of the integrated circuits. For example, a silicon layer or surface would occur at the base contact level of the substrate, and another conducting surface, such as an aluminum or titanium nitride surface, would occur at the via level in a multilevel substrate application.

The physical mechanism in a sputter etch cleaning process is the bombardment and resulting removal or "sputtering" of particles from the substrate surface. By using low energy (100–300 eV) argon ions from the gas plasma, a "soft" sputter etch is produced. The substrate is electrically biased to attract the positive plasma ions, to bombard the surface layer, and the sputtering of the substrate surface etches away a small amount of the surface layer. A typical and desirable etch rate for $SiO_2$ in such a process is approximately 300–500 Å/min., while the etch rate for a metal oxide is lower. For example, the etch rate for aluminum oxide $Al_2O_3$ would generally be about one-fourth of the etch rate for $SiO_2$. For a plasma sputter etch, a high density plasma is provided by the ICP source which utilizes an RF power supply or source. A substrate bias is provided by a second RF source electrically coupled to the substrate. Independent RF sources for the plasma and substrate bias provide independent control of the plasma ion current (plasma density) and the ion energy (substrate bias) delivered at the substrate surface being sputter etched. The product of the plasma ion current and ion energy determines the etch rate for a particular material to be sputter etched.

For silicon substrates, which are commonly used in IC fabrication, the substrate will comprise a significant amount of $SiO_2$. Therefore, when large amounts of the oxide ($SiO_2$) layer are sputtered during the pre-clean etch, the etched $SiO_2$ particles pass through the high density plasma. The particles are then broken down into activated oxygen in the form of oxide radicals or free oxygen which are then adsorbed onto the processing chamber walls. The chamber walls are formed of a dielectric material. Such accumulation of oxygen in the chamber walls will detrimentally affect the efficiency of the processing chamber and the sputter etch process for subsequent substrates being processed. Specifically, during subsequent etches of additional substrates, the adsorbed oxygen is evolved from the walls, and the evolved or reflux oxygen is activated in the plasma and suppresses the etch rate, which reduces the overall efficiency of the processing system. The oxygen levels from such etching have been observed to remain in the walls of the chamber over long periods of time, and they will generally be at the same level even after the chamber is not used for such etching processes for a couple of days. Therefore, activated oxygen in the plasma etch process is undesirable. However, since oxide and oxygen-containing layers of the substrates are being etched, such oxygen reflux from the chamber walls in subsequent etches is a problem which must be addressed.

Accordingly, it is an object of the present invention to improve the efficiency of a sputter etching processing system. It is specifically an objective to improve a sputter etching system which is utilized to pre-clean an oxide layer, such as silicon dioxide, from a series of substrates.

It is a further objective of the present invention to reduce the amount of oxygen evolved from the wall of a processing chamber during sputter etching of a substrate and subsequent sputter etching of additional substrates.

It is another objective of the present invention to reduce the effect of any oxygen evolved from the walls of a processing chamber during sputter etching.

It is still another objective of the present invention to increase the overall etch rate and processing efficiency of a sputter etch processing system.

SUMMARY OF THE INVENTION

The above objectives, and other objectives, are addressed by the present invention which reduces the effect of activated oxygen within the plasma on the etch rate of a soft sputter etch process performed on a series of substrates having oxygen-containing material layers, such as oxide layers. Specifically, the present invention maintains the high etch rates of oxide layers on substrates which are subsequently etched after the etch of a first substrate having an oxide layer. To that end, the present invention addresses the problems in the prior art by reducing the amount of activated oxygen generated by the sputter etch of an oxide layer, and further, by reducing the amount of activated oxygen adsorbed by the chamber walls and subsequently evolved during subsequent sputter etch processes.

In accordance with one aspect of the present invention, a second substrate is utilized within the processing chamber proximate a first substrate which is actually being processed. The second substrate is formed of a material which reacts with activated oxygen to form a stable oxygen-containing compound. The stable compound is then evacuated by the processing system vacuum system. Less activated oxygen is then adsorbed by the chamber wall. In that way, when a first substrate to be processed includes a material layer containing oxygen, activated oxygen generated by the etch process is stabilized by material particles etched from the second substrate. Furthermore, not only is the level of activated oxygen during the etch process reduced, but also the residual oxygen in the processing chamber is reduced such that less oxygen is evolved from the chamber wall and activated during subsequent sputter etching processes. Both the first and second substrates are biased with RF electrical energy so that the plasma etches both the oxygen-containing material layer of the first substrate being processed and also the second substrate to yield the oxygen-stabilizing element.

In a preferred embodiment of the invention, the second substrate is configured in the form of a ring to surround a peripheral edge of the first substrate. The ring might be formed with an open center to receive the first substrate being processed in the center thereof. Alternatively, the second substrate may have a larger diameter than the first substrate wherein the first substrate is positioned concentrically on top of the second substrate. In such a scenario, the larger diameter second substrate would effectively form a ring around the peripheral edge of the first substrate to provide the desired etch of the second substrate material. Herein, the second substrate ring is referred to as a focus ring. The first substrate being etched will generally include a material oxide layer. The material forming the second substrate might be any one of silicon, aluminum, titanium, tantalum and/or copper. As noted, it is necessary that the material etched from the second substrate combine with oxygen to form a stable compound which may then be evacuated from the processing chamber.

In accordance with another aspect of the present invention, a method of sputter etching a substrate containing an oxide layer is provided wherein a substrate is positioned within a processing chamber and a process gas is ionized into a gas plasma by electrical energy inductively coupled into the processing chamber. The substrate is biased with an RF power supply to establish an RF bias voltage thereon to achieve the sputter etch, and a power level is selected for the substrate power supply. Electrical energy is coupled to the chamber and plasma using an inductive element, such as a helical coil wound around the processing chamber. The inductive element or coil is coupled to an RF power supply.

In order to reduce the amount of activated oxygen within the plasma, an etching power level is selected which lowers the plasma density while maintaining a suitable etch rate and a soft, non-aggressive etch. To that end, a first power level for the inductive element power supply is determined which would establish a bias voltage level of the substrate of approximately 100 Volts. A substrate bias of less than 100 Volts detrimentally affects the etch rate in a rapid, non-linear fashion. Next, a second, lower power level for the inductive element power supply is determined which would lower the density of the plasma, and lower the ion current, which would raise the bias voltage level of the substrate to a level not significantly higher than 300 Volts. A substrate bias of greater than 300 Volts would generally yield an etch which would be too aggressive for a soft etch, pre-clean process. With the range established by the first and second power levels, an etching power level is selected for the inductive element power supply. The etching power level is selected to be approximately in the range between the first and second power levels but is closer to the second power level than the first power level. Etching with a lower power level, in accordance with the principles of the present invention, reduces the amount of activated oxygen which is generated by the plasma and thus reduces the amount of oxygen adsorbed by the chamber wall and subsequently evolved in subsequent etches. In order to achieve a suitable etch rate, the etching power level is selected to establish an etch rate in the range of approximately 300–500 Å/min., in accordance with one aspect of the present invention, such as the method utilized to etch a silicon wafer containing a layer of silicon dioxide. In accordance with another aspect of the present invention for etching a substrate having a metal oxide layer thereon, the etching power level is selected to establish an etch rate in the range of approximately 75–125 Å/min.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
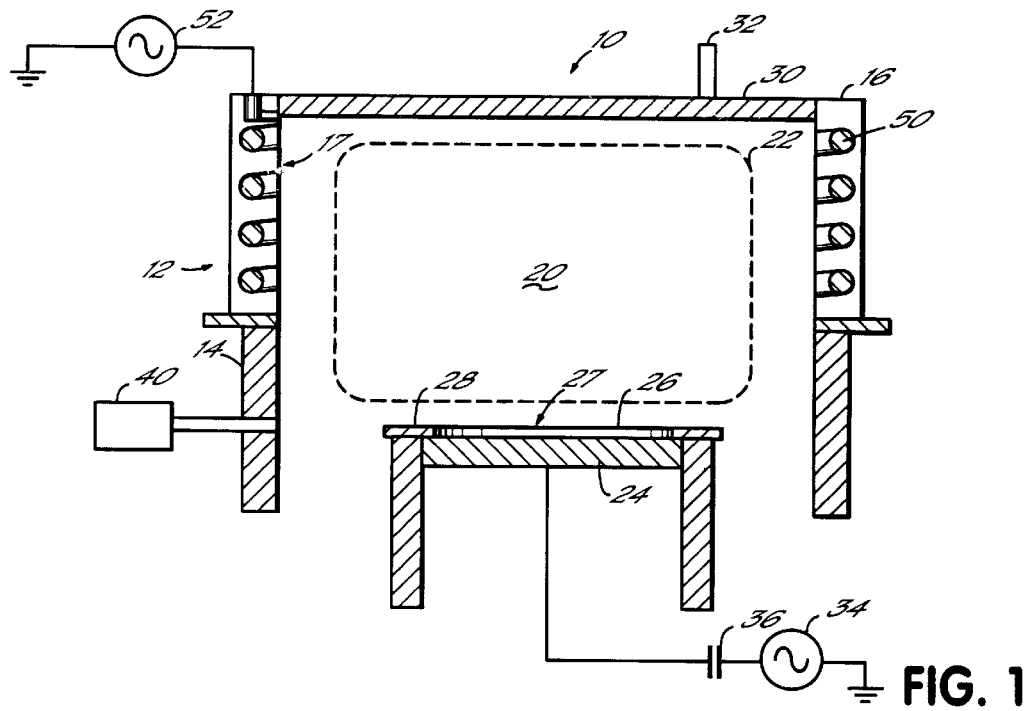
FIGS. 1 and 1A show a schematic, cross-sectional view of an inductively-coupled plasma (ICP) processing system utilized in accordance with the principles of the present invention.
Figure 1A:
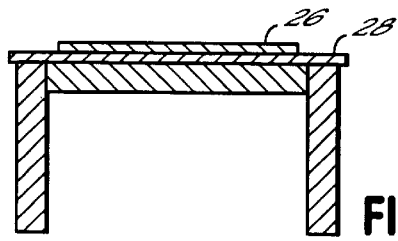

FIG. 1 illustrates, in a schematic and cross-sectional form, a plasma etch system for use in performing the methods of the present invention. The processing system 10 includes a processing chamber 12 having a metal base portion 14 formed of a suitable metal, such as stainless steel, and an upper dielectric portion 16 sitting above the metal portion 14 for inductively coupling electrical energy into a process space 20 to form a gas plasma indicated by reference numeral 22 as discussed further hereinbelow. The dielectric portion 16 of the chamber is often formed of quartz or a ceramic and, in the art, is sometimes referred to as a "bell jar." The "bell jar" design is popular for processing systems using inductively coupled plasmas (ICPs). The processing chamber 12 includes a substrate support 24 therein for supporting a first substrate 26 to be processed. A focus ring or second substrate 28 is supported by support 24 and is positioned proximate the substrate 26. In one embodiment, the focus ring extends around the outer periphery of the substrate 26 for the purposes of the present invention as discussed further hereinbelow. In one aspect of the invention, the second substrate 28 may be removed from the system. A process chamber lid 30 seals the top of chamber 12 and includes a gas feedthrough 32 which is coupled to an appropriate supply of process gas (not shown), such as argon. The process gas is introduced at a low pressure and is utilized to produce a gas plasma 22 according to the principles of the present invention, as discussed further hereinbelow.

The substrate support 24 is electrically conductive and is coupled to an RF power supply 34, which is utilized to bias the substrate support 24, substrate 26, and the substrate or focus ring 28 with RF electrical energy for the purpose of etching the substrates 26, 28. Focus ring 28 is also, therefore, appropriately biased by the RF power supply 34 along with the substrate 26, as discussed further hereinbelow. A filtering capacitor 36 is preferably utilized between the substrate support 24 and RF power supply 34 for blocking any DC signals from the power supply 34.

In order to induce a plasma 22 within the process space 20, a vacuum system 40 is utilized to introduce and maintain a suitably low pressure in the process space 20, for example, in the range of 0.5–10 mTorr. For inductively coupling electrical energy into the plasma 22 to ignite and sustain the plasma, an inductive element, such as a coil element 50 is wound around the "bell jar" ceramic portion 16 of the processing chamber 12. RF energy is inductively coupled through the ceramic portion 16 and into the process space 20. To that end, the inductive element 50 is coupled to an appropriate RF power supply 52 which biases the inductive element in accordance with known principles for ICP systems. While one suitable inductive coil element is a helical coil wound around the chamber dielectric portion as shown in FIG. 1, another coil element might be a flat coil which couples energy into space 22 from the top of the chamber. In such a scenario, the top of the chamber would have to be formed of a suitable dielectric material or would have to include a dielectric window, or a window of a very thin poor conductor, such as silicon.

When etching a substrate to pre-clean or remove a layer of oxide or another oxygen-containing layer, generally a "soft" or non-aggressive etch is desired. To that end, substrate 26 is biased with an RF bias voltage which is not exceedingly high in order to avoid an aggressive etch. Of course, too low of a bias voltage will reduce the etch rate below a practical level. The biased substrate 26 and plasma 22 interact such that the voltage and current conditions on the substrate surface 27, which is to be etched, will vary. When the power delivered to the inductive element 50 is varied and the bias power to the substrate remains constant, the current and bias voltage at substrate surface 27 will automatically vary according to known plasma principles to adjust to the plasma variation while maintaining a relatively constant RF bias power delivered to the substrate 26. Specifically, increasing the inductively coupled power to element 50 and thus increasing the power to plasma 22, will increase the particle density of the plasma and will thus further increase the ion current density on substrate surface 27. With a constant bias power level delivered to the substrate 26 by RF power supply 34, the bias voltage at the substrate surface 27 will decrease to adapt to the increase in ion current on surface 27 which corresponds to the increased density of plasma 22. Similarly, if the power level of the RF power supply 52 coupling energy to the inductive element 50 is reduced, the density of plasma 22 and resulting ion current on substrate surface 27 is also reduced. Again, assuming a constant bias power level being delivered to the substrate 26, the bias voltage at substrate surface 27 will increase.

In accordance with the aspects of the present invention, an etching power level for the inductive element RF power supply 52 is selected to achieve a suitable, non-aggressive etch rate while controlling activated oxygen in the plasma which is subsequently evolved from an inside surface 17 of the dielectric portion 16. To that end, embodiments of the invention have been developed to substantially reduce oxygen evolution or reflux from the wall surface 17 of dielectric portion 16 in order to allow a series of etch rates to be maintained at a desired high etch rate. The present invention thereby reduces the effects of evolved oxygen on subsequent etch rates and increases the overall efficiency of an ICP system used to etch oxide layers.

In accordance with one aspect of the present invention as discussed further hereinbelow, another or second substrate 28 is positioned proximate the first substrate 26 being processed. The other substrate 28, which in one preferred form is a ring surrounding substrate 26, is formed of a material which reacts with activated oxygen to form a stable oxygen-containing compound. It has been observed that etching of the other substrate 28 of such a material, such as a silicon ring, along with the primary substrate 26, reduces the oxygen levels in the process space. The rate of decrease of the oxygen level during the etch of a silicon ring 28, for example, is proportional to the etch rate of the silicon. In the case of a silicon ring 28, the silicon etched from the ring 28 passivates the wall 17 by reacting with activated oxygen or oxygen compounds to form a stable compound, such as $SiO_2$. When the background activated oxygen level of the process is kept low, high etch rates are maintained in subsequent etches because less oxygen is subsequently evolved to drive down the etch rate. Other conducting materials, such as aluminum, titanium, titanium nitride, tantalum, tantalum nitride and copper may also provide the same effect.

In accordance with another aspect of the present invention as discussed further hereinbelow, the power to the inductive element, such as coil 50, is relatively lower than the level which might be typically used in a non-aggressive, soft etch of a substrate. The power level for the inductive coil power supply is determined in accordance with the present invention while still maintaining a suitable etch rate at surface 27. The decreased or lower RF power delivered to the coil 50 produces a lower plasma density in space 20. The lower plasma density reduces the interaction of the etched products from surface 27 with the plasma discharge, thus lowering the amount of activated oxygen created in the process and thereby lowering adsorption of the oxygen on the chamber wall 17. As such, less oxygen is evolved from the chamber wall 17 during subsequent etches. Since the lower plasma density reduces the process gas ion current to the wafer surface 27, a higher bias level at the substrate is required to retain a suitably high etch rate. A higher bias level of the substrate 26 will occur automatically for a selected power level of RF power supply 34, since lower plasma density (ion current) leads automatically to the higher substrate bias. To observe the benefits of the various aspects of the invention, a focus ring 28 might be utilized in combination with a lower etching power level to the plasma.

In accordance with one principle of the present invention, a second substrate 28 is utilized with the first or primary substrate 26 and is made of a material which will react with the activated oxygen in the plasma to passivate the wall 17 of the chamber and prevent significant reductions in the etch rate of a series of substrates, such as $SiO_2$ substrates. The second substrate 28 may be made of various materials, such as anodized aluminum, silicon, or silicon carbide, and when the second substrate is etched along with the substrate being processed, the particles from the second substrate react with the plasma activated oxygen to form stable compounds, which are then evacuated from the process space or are deposited on the walls as stable compounds. The stable compounds that are evacuated or deposited will thus reduce the activated oxygen which is subsequently evolved from the chamber wall 17 upon subsequent etches. The wall 17 is thereby passivated to some degree by the second substrate 28. In that way, a suitable etch rate is maintained for a series of substrates being processed. The second substrate is positioned in the plasma discharge, as shown by element 28 in FIG. 1. The second substrate 28 is positioned proximate the primary substrate 26 being processed and is maintained at the same bias level as the processed substrate.

In one embodiment of the invention, the second substrate is in the form of a ring 28 which may be positioned concentrically with the substrate 26 being processed in the processing chamber. The ring substrate 28 is referred to as a focus ring. Referring to FIG. 1, a focus ring 28 is shown positioned proximate substrate 26 surrounding the periphery of the substrate 26 being processed. In one embodiment of the invention, the focus ring 28 will be in the shape of an actual ring with a space in the middle to receive substrate 26. In accordance with another aspect of the present invention, as discussed further hereinbelow, the focus ring 28 might be formed by positioning a circular substrate 26 of one diameter on top of another circular substrate 28 having a larger diameter. The difference in diameters between the two substrates will be reflected by an outer peripheral portion of the substrate 28 extending around the outer peripheral edges of the smaller substrate 26.

Since focus ring 28 is positioned on substrate support 24, it is also biased by the power supply 34. Accordingly, both the substrate 26 and focus ring 28 will be simultaneously etched by plasma 22 so that particles are sputtered or cleaned from exposed surfaces 27, 29 thereof. Again, the focus ring 28 is made up of material which, when sputtered or etched, will react with the activated oxygen in the plasma 22 to thus form stable oxygen compounds, such as $SiO_2$. The stable compounds are evacuated from the system under vacuum or deposited upon the walls and thereby reduce the amount of activated oxygen which is adsorbed by the wall 17 in the chamber. Accordingly, the focus ring reduces the amount of oxygen which is subsequently evolved during processing of a series of substrates. The material of focus ring 28 may be dependent upon the type of substrate being etched, as discussed further hereinbelow.

Figure 2:
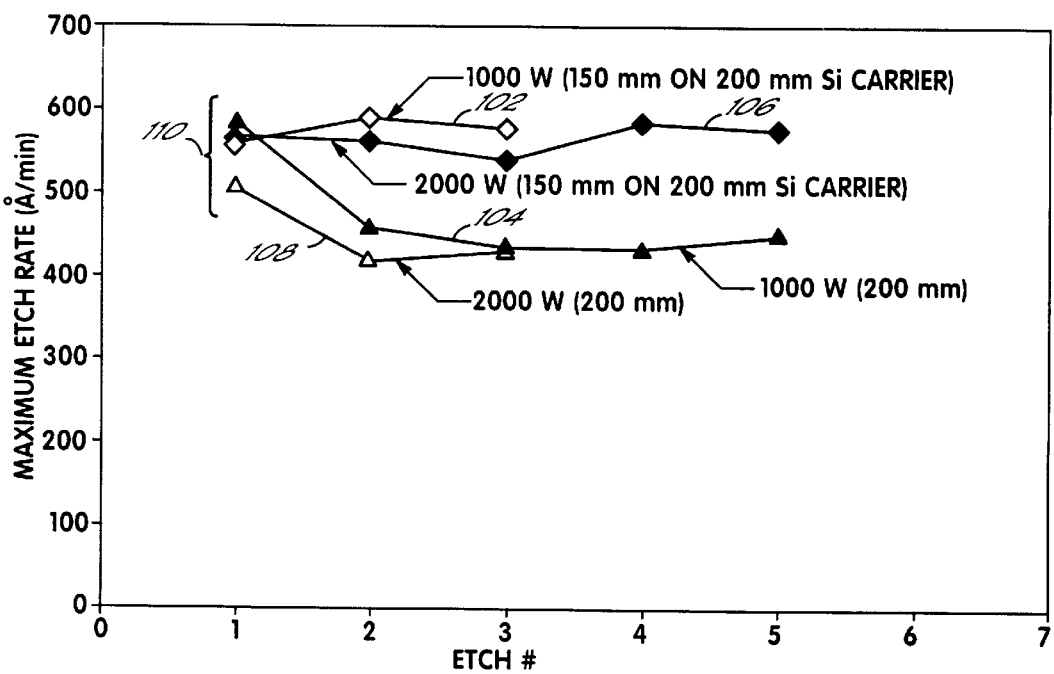
FIG. 2 is a graph of etch rates for an embodiment of the present invention at various plasma power levels to illustrate advantages of the present invention.

In one embodiment of the invention, as noted above, a focus ring is created by positioning a smaller 150 mm diameter substrate to be processed on top of a larger 200 mm diameter substrate. In testing the invention, a 200 mm silicon substrate was positioned to rest on a 200 mm substrate stage, or substrate support 24, as shown in FIG. 1. The wafer to be processed was a 150 mm $SiO_2$ substrate which was centered on the 200 mm silicon substrate such that the excess diameter of the larger silicon substrate formed the focus ring. Both substrates were then etched at various power levels, as illustrated in FIG. 2. Furthermore, a single 200 mm diameter $SiO_2$ substrate was etched at various power levels without any sort of focus ring. Turning to FIG. 2, the maximum etch rates are illustrated for a series of etches at the various power levels selected. For example, reference numerals 102 and 104 refer to a series of etches made at a plasma or inductive coil power level of approximately 1000 Watts, whereas reference numerals 106 and 108 refer to a series of etches made at a plasma power level of approximately 2000 Watts. Furthermore, reference numerals 102 and 106 refer to a series of etches made utilizing a 150 mm $SiO_2$ substrate on top of a 200 mm silicon substrate to form an outer silicon focus ring in accordance with the principles of the present invention. The series of etches identified by numerals 104, 108 were made without any focus ring. As may be seen, the etch rates achieved utilizing a focus ring of material which stabilizes the activated oxygen and thereby passivates the chamber walls in accordance with the principles of the present invention are higher after the first etch than those etch rates achieved without a focus ring. That is, the first etch in each series, indicated by reference numeral 110, was generally at a very similar etch rate. However, etching subsequent substrates without the focus ring produced a drop in the etch rate for both etching power levels of 1000 Watts and 2000 Watts, as illustrated by the series designated by reference numerals 104, 108. That is, the etch rates without the focus ring dropped by about 15–20% after the first substrate was etched, in a low background oxygen environment. When a focus ring was utilized by positioning a 150 mm substrate on a 200 mm silicon substrate, a high etch rate was maintained over the series of etches at both etching power levels of 1000 Watts and 2000 Wafts, as illustrated by reference numerals 102, 106. In accordance with the principles of the present invention, combining both a low etching power level of approximately 1000 Watts with the focus ring 78, in accordance with the principles of the present invention, yields the highest etch rate over the various series, as indicated by reference numeral 102. Conversely, utilizing a higher etching power level of 2000 Watts without a focus ring yields the lowest etch rate, as indicated by reference numeral 108. Therefore, various aspects of the present invention, such as a lower etching power level and a focus ring, can be used to maintain a consistently high plasma etch rate.

Figure 3:
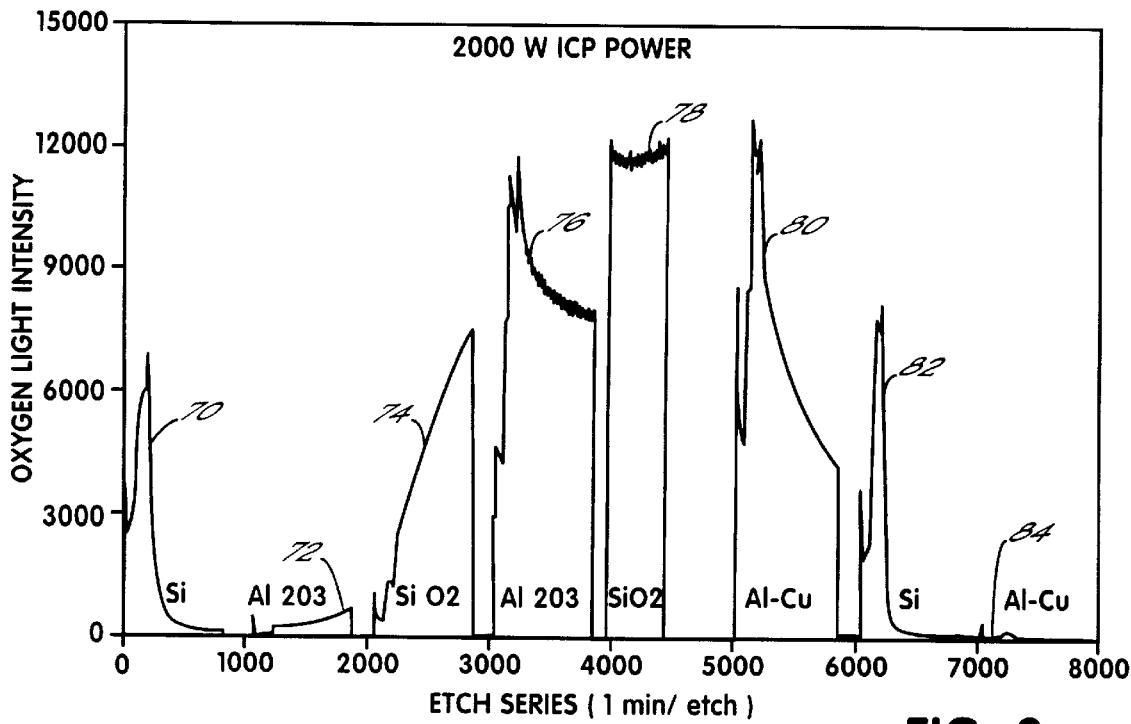
FIG. 3 is a graph of light emission intensity for oxygen generated by the etching of a series of different substrates to illustrate advantages of the present invention.

FIG. 3 illustrates light transmission from oxygen atoms in the plasma discharge for a series of one minute etches of different substrate materials in arbitrary units. All of the etches referred to in FIG. 3 were performed at a 2000 Watt power level to the inductive element 50 driving the plasma. The horizontal axis of FIG. 3 reflects a series of one minute etches with approximately 3–5 minutes (not shown to scale) between etches. The vertical axis measures the intensity of any oxygen light in the plasma, indicating undesired activated oxygen evolved from the chamber wall 17. The first etch 70 of the series is an etch of silicon (Si) and shows the initially high oxygen level being reduced to a very low level by etching a pure silicon substrate. The silicon substrate material that is etched combines with the activated oxygen to form a stable compound. The next etch 72 of an aluminum oxide ($Al_2O_3$) substrate shows a low but rising level of oxygen in the plasma. The etch rate for substrate etch 72 was relatively high (163 Å/min.). The following etch 74 of an $SiO_2$ substrate brought the reflux oxygen back up to a very high level and the next $Al_2O_3$ substrate (etch 76) had a high oxygen level and a much lower etch rate (approximately 78 Å/min.). Another $SiO_2$ substrate (etch 78) further raised the oxygen level in the system to a saturated level. The series of etches in FIG. 3 illustrates that the source of the undesired oxygen, starting from a low oxygen background atmosphere (etch 70), is the etching of a series of oxide wafers. The oxygen produced from the series of sputter etch processes is stored up on the dielectric wall 17 of the chamber in the first etches, and on subsequent etches the primary source of undesired activated oxygen is the reflux or evolved oxygen from the wall 17, not the oxygen which is currently being etched from the substrate surface 27.

Referring again to FIG. 3, an aluminum-copper (Al—Cu) substrate was next etched (etch 80). The oxygen level in the plasma at etch 80 decreased slowly due to the reaction of the copper and aluminum with the oxygen, but the oxygen level did not decrease to the very low level that was achieved with the next silicon (Si) substrate (etch 82). With the final substrate (etch 84), it can be seen that the plasma oxygen level remained low for an aluminum-copper (Al—Cu) substrate etched after a silicon substrate (etch 84). The first aluminum-copper (Al—Cu) substrate (etch 80) etched slowly at the high background oxygen level within the system, and the native oxide coating was not fully etched away. As a result, the plasma oxygen level remained high during the etch. The second aluminum-copper (Al—Cu) substrate (etch 84), with a low background oxygen level, etched through the native oxide relatively quickly, allowing the underlying aluminum-copper to be etched and thus further reduce the undesired oxygen level in the plasma.

Figure 4:
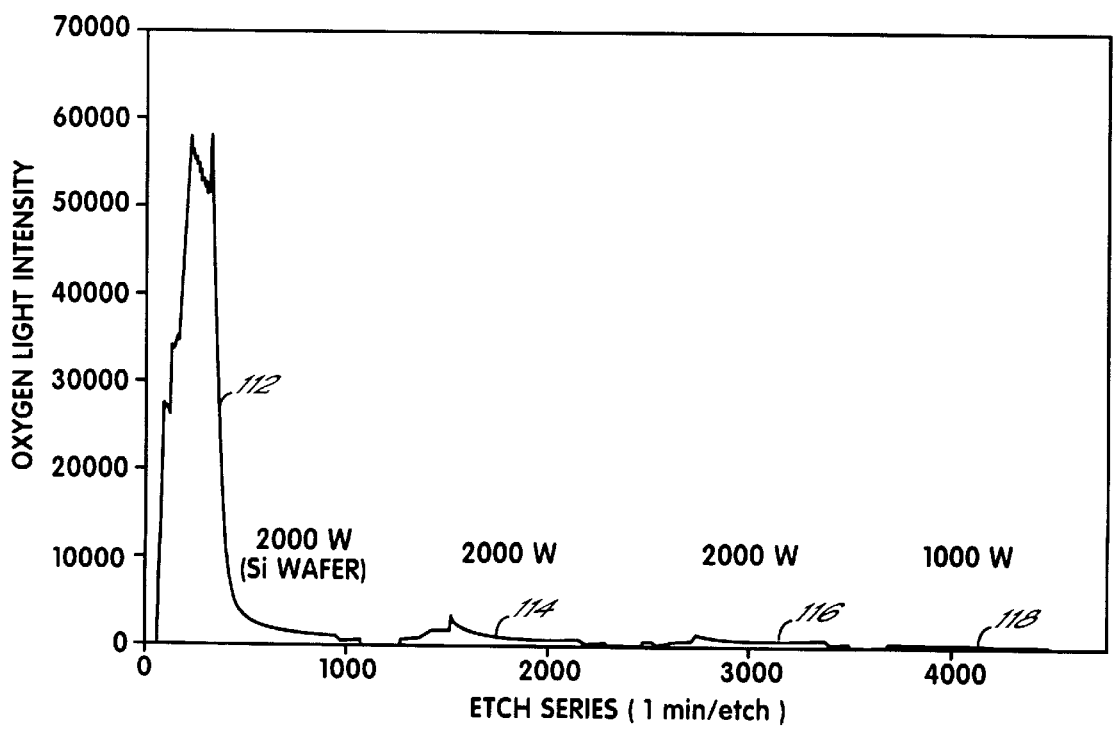
FIG. 4 is a graph of the light emission intensity for oxygen generated for a series of substrate etches at different plasma power levels to illustrate advantages of the present invention.

FIG. 4 illustrates oxygen levels in the plasma as indicated by measured oxygen light intensity in arbitrary units for 150 mm $SiO_2$ substrates utilized on 200 mm silicon carrier substrates which form the focus ring 28 in accordance with the principles of the present invention. FIG. 4 illustrates a series of four etches, each of approximately one minute per etch. The first etch, as indicated by reference numeral 112, was made utilizing a 150 mm silicon substrate at 2000 Watts etching power in order to reduce the initial background oxygen level in the plasma to a very low level. As may be seen in FIG. 4 by the drastic fall of the oxygen level in the plasma during the etch, the background oxygen level was reduced significantly. The next two etches, indicated by reference numerals 114, 116 involve the etching of an $SiO_2$ substrate at etching power levels of 2000 Watts. As illustrated, the oxygen level for etching of the oxide was still maintained at a significantly low level. The etches indicated by numerals 114, 116 can be compared with the etch 74 in FIG. 3, wherein a 200 mm $SiO_2$ substrate was etched at an etching or coil power level of 2000 Watts. As shown in FIG. 3, the etch of reference numeral 74, yielded an oxygen level in the plasma which climbed to a significant amount during the etch. However, a similar power level of 2000 Watts used to etch an $SiO_2$ substrate of 150 mm using a focus ring yielded a significantly lower activated oxygen level in the plasma as shown in FIG. 4. Utilizing both a lower etching power level of 1000 Watts and a focus ring, in accordance with the present invention, as indicated by the etch of reference numeral 118 yields an oxygen level even lower than those etches 114, 116 made at a higher etching power level of 2000 Watts.

Accordingly, a second substrate or focus ring made of a material, such as silicon, which will react with activated oxygen within a plasma, may be utilized in a soft plasma etch to maintain significant etch rates by reducing the levels of activated oxygen within the plasma which might be adsorbed by the walls. When less oxygen is adsorbed by the walls, the level of oxygen subsequently evolved from the walls in subsequent etches is also reduced. This allows the etch rates in subsequent etches to be maintained at desirable levels. While silicon is utilized as a material for the focus ring in the example set forth above, aluminum and titanium nitride (TiN) will yield a similar effect as silicon (see FIG. 7) in reacting with the activated oxygen within the plasma and thereby passivating the chamber walls to prevent subsequent evolution of oxygen and reduced etch rates in subsequent etches or series of etches. It is also anticipated that other materials, such as titanium, copper, tantalum and/or tantalum nitride would also provide the desired effect of stabilizing the activated oxygen within the plasma to prevent its adsorption into the chamber wall 17 and subsequent evolution in subsequent etches. Since the second substrate or focus ring 28 is etched along with the substrate being processed, there may be some risk of contaminating the processed substrate 26 with material from the focus ring. Accordingly, the focus ring material should be selected to minimize such contamination. For example, a focus ring of silicon or titanium would be appropriate for contact level etches and applications because silicon is generally being pre-cleaned in the etch, and titanium will subsequently be deposited on the cleaned silicon layer to form the contact. For via level applications, focus rings made of aluminum, titanium nitride, or titanium might be used because such materials will be deposited on the pre-cleaned or etched surfaces. To that end, the selected material for focus ring 28 would depend upon the surface which is being pre-cleaned by the etch process, as well as upon the material which will be deposited upon the pre-cleaned surface.

Figure 5:
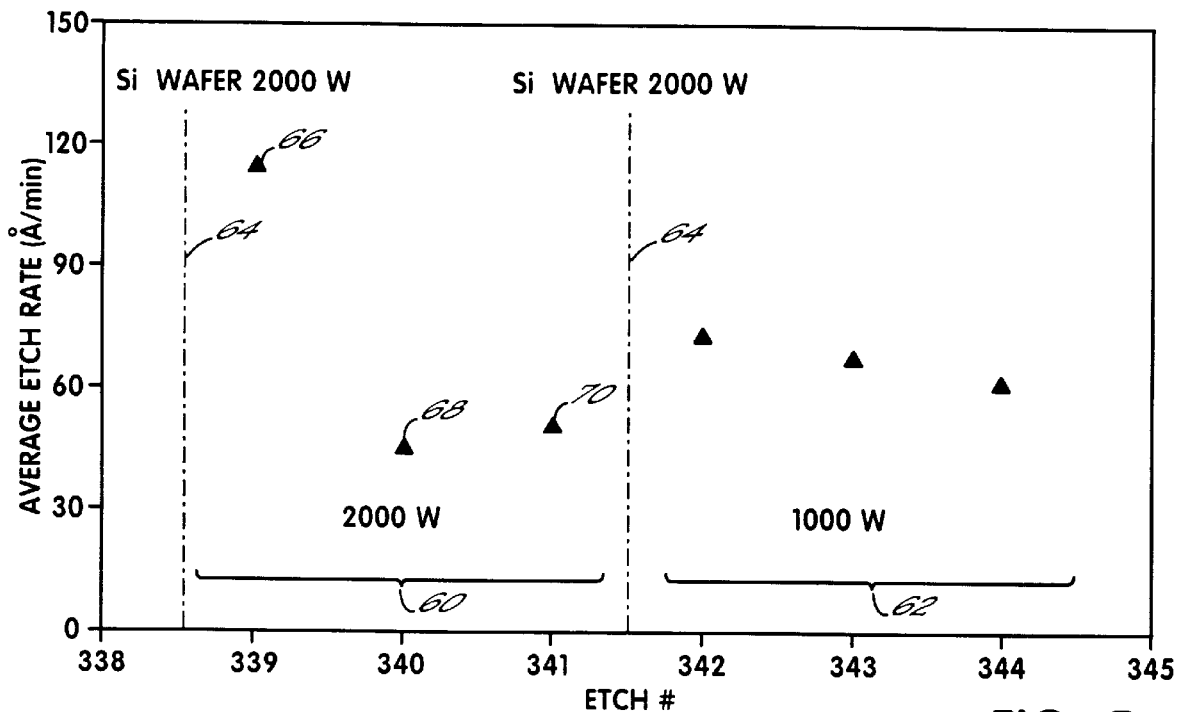
FIG. 5 is a graph of etch rates at various plasma power levels to illustrate advantages of the present invention.

In another embodiment of the invention, FIG. 1 is a pre-clean etch system which might be utilized to practice the present invention. Utilizing a system like system 10 of FIG. 1 (but with an insulating focus ring), pre-clean etches were made of several series of substrates. Etch rates in Å/min for 200 mm substrates coated with 3000 Å of aluminum oxide ($Al_2O_3$) are shown in FIG. 5. Two sets or series 60, 62 of etches are shown with the first substrate of each set etched immediately after etching a silicon substrate. The silicon substrate etches are indicated by reference numeral 64, and are initially made to significantly reduce the background or adsorbed oxygen level to a very low level The silicon passivates the wall 17 of the chamber. The first set 60 was etched with an inductive coil power level of 2000 Watts and has markedly lower etch rates which occur in subsequent etches after the first substrate etch. Specifically, the substrate indicated by reference numeral 66 and number 339 of the series of etches performed by the inventors, had an average etch rate of close to 120 Å/min. The next, subsequent substrate, indicated by reference numeral 68 (etch no. 340), however, dropped to a rate of around 45 Å/min. The next subsequent substrate etch of reference numeral 70 (etch no. 341), was slightly higher, but still below 60 Å/min., or less than approximately one-half of the etch rate achieved with the earlier substrate etch indicated by numeral 66. The inductive coil power supply for the substrate etch series 60 was set at a level of approximately 2000 Watts.

Figure 6:
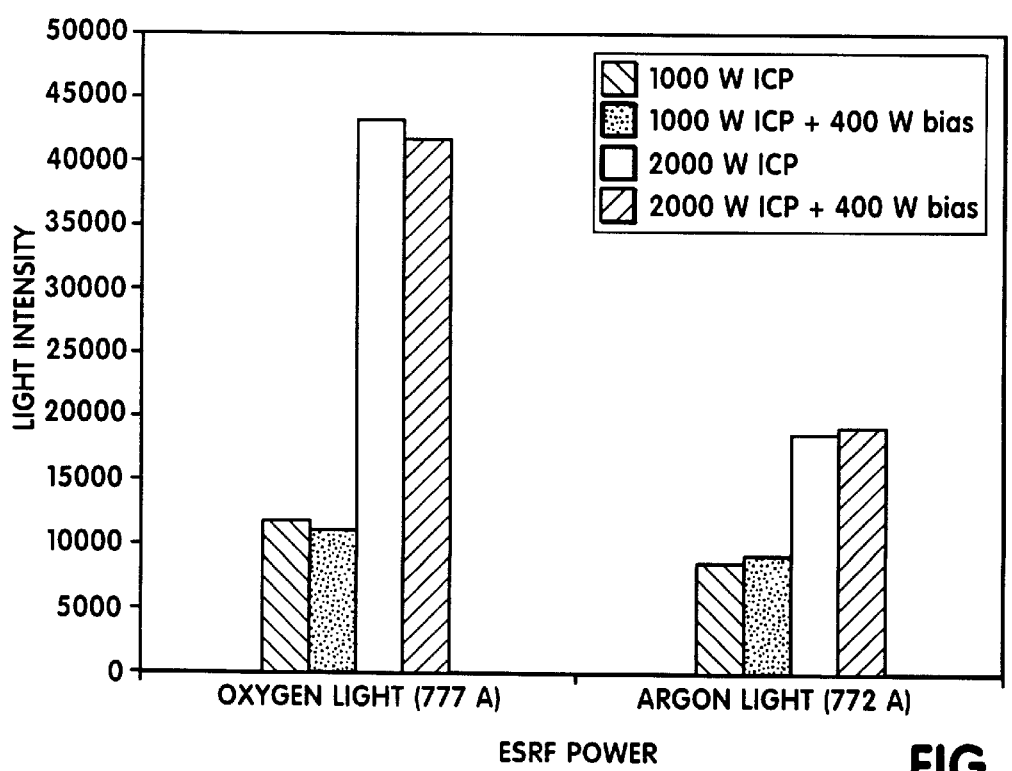
FIG. 6 is a graph of light emission intensity for certain elements and plasma power levels to illustrate advantages of the present invention.

In accordance with the principles of the present invention, a lower etching power level for the inductive coil power supply 52 was chosen for the substrates in etch series 62. The second set or series 62 was etched with an inductive coil power level of 1000 Watts. The substrates of series 62 show little significant change in etch rate from substrate to substrate, although there is a slight decrease in etch rate across the series. Therefore, an improved consistency and repeatability of a certain etch rate was achieved using lower etching power for the coil. As seen in FIG. 5, the average etch rate of the series 62 is reduced at a coil power level of 1000 Watts compared to the series 60 at 2000 Watts, because the same bias power level at the substrate was used for the two series, and the bias voltage increase of the substrates was not sufficient to overcome the decreased plasma current density at the lower 1000 Watt power level. The higher etch rate achieved for the first 2000 Watt substrate series 60 can be achieved at 1000 Watt coil power level by increasing the bias power to the substrate 26. Light emission intensity from oxygen and argon atoms in the plasma discharge for substrate etches of $SiO_2$ on 200 mm substrates, as measured in arbitrary units, were compared in FIG. 6 by the inventors to determine the origin, during the soft etch process, of the undesired activated oxygen. The oxygen and argon emissions for 1000 Watt and 2000 Watt plasma discharges are shown under high background oxygen conditions and with and without the presence of bias power to the substrate of 400 Watts. The oxygen level measured was not particularly dependent on the presence of the bias power of 400 Watts, indicating to the inventors that the predominant source of undesired activated oxygen during the etch process is not the oxygen derived from the etching of the substrate surface 27, but rather the background oxygen evolved or derived from the wall 17. Otherwise the higher etch rate resulting from the substrate bias of 400 Watts would have been indicated by a higher oxygen level.

However, it can also be seen that the oxygen intensity level at 2000 Watts is approximately 4 times higher than the oxygen intensity level at 1000 Watts. In the same scenario, the argon intensity level at 2000 Watts is only about twice the intensity level at the lower 1000 Watt power level. The argon intensity level agrees roughly with the measured density increase in the plasma produced at higher coil power levels. The oxygen intensity level increases by the square of the increase in the plasma density. This is due to the higher density plasma discharge producing more oxygen evolution or reflux from the chamber wall 17 and then exciting the evolved oxygen atoms to produce the undesired activated oxygen indicated by the emission within the plasma.

Figure 7:
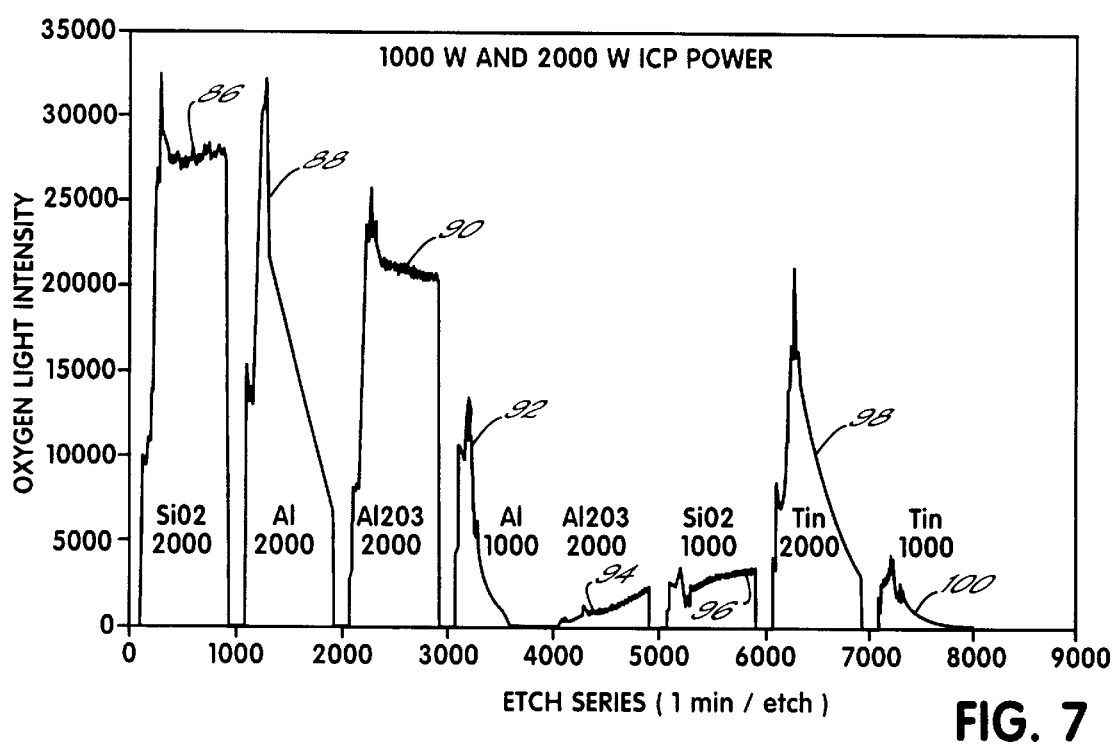
FIG. 7 is a graph similar to FIG. 3 with a series of substrate etches at different plasma power levels.

In the set of etches illustrated in FIG. 7, a high plasma oxygen level was maintained through the first three etches 86, 88, 90, including an aluminum wafer etched at a 2000 Watts plasma power level to inductive coil 50. However, the next etch 92, of an aluminum wafer at 1000 Watts power level to coil 50 reduced the oxygen in the plasma to a very low level. Since the background plasma oxygen level remains much lower at a 1000 Watt power level to the inductive coil 50, even with the wall of the chamber loaded or saturated with oxygen from previous etches, the etch rate of the native oxide in etch 92 is high enough to etch through to the aluminum, which then further passivates the wall 17 of chamber 12, much like silicon. The rest of the etches in FIG. 7 illustrate more examples of lower plasma oxygen levels in etches using around a 1000 Watt power level to the inductive coil. TiN substrate etches also reduce plasma oxygen levels significantly, especially at 1000 Watts coil power, as shown in etches 98, 100.

From the determination by the inventors that the reduction in etch rate of subsequent etches is caused by background oxygen in the plasma which originates and is evolved from the dielectric wall 17, the present invention addresses that problem by a method which reduces the background oxygen while maintaining a significant and desirable etch rate and avoiding an overly aggressive etch of substrate surface 27.

In accordance with this feature of the invention, a substrate, such as a silicon dioxide ($SiO_2$) substrate is positioned within processing chamber 12 as shown in FIG. 1 (with or without focus ring 28, as discussed below). A process gas, such as argon, is then introduced into the process space 20 of the chamber through an appropriate inlet 32. Electrical energy is then inductively coupled into the process space 20 to form and maintain a plasma 22. In one embodiment, as shown in FIG. 1, energy is coupled to the plasma by biasing an inductive element, such as helical coil 50 which wraps around dielectric portion 16 with an RF power supply 52. Plasma 22 is thus maintained by the inductively coupled energy from coil 50, and the power level for the inductive coil power supply will determine the characteristics of the plasma 22, such as the density of the ionized argon molecules therein. It will be readily understood that other process gases might also be utilized besides argon. Furthermore, other elements besides a helical coil might be used to couple energy to plasma 22. For example, a flat coil might be positioned at the top of the chamber to inductively couple energy through the top of the chamber and into plasma 22.

In accordance with the principles of the present invention, the substrate is biased with an RF power supply which establishes a bias voltage at substrate surface 27. A power level is selected for substrate power supply 34 and is generally maintained constant during the sputter etching method of the invention. With the substrate biased in a range anywhere from 200–800 Watts, for example, a first power level for the inductive coil power supply 52 is then determined. The first power level for power supply 52 is determined by establishing an RF bias voltage level at substrate 26 which is approximately 100 Volts. Such a substrate vias of substrate surface 27 is generally at the lower end of the voltage bias that is required in a soft sputter etch process to achieve a sufficient etch rate. A power level for supply 52 which produces a plasma that yields a substrate bias voltage significantly less than 100 Volts will detrimentally affect the etch rate. Below the 100 Volt bias level, the plasma etch rate drops off non-linearly.

Next, a second, lower power level is determined for the inductive coil power supply 52. The second, lower power level reduces the ion density (current density) of plasma 22 and will thus raise the bias voltage level of substrate 26. As discussed above, the characteristics and density of plasma 22 affect the plasma current and bias voltage levels at substrate surface 27. A lower coil power yields a plasma with a lower density of argon ions. Accordingly, the argon ion current density at substrate surface 27 is reduced. For sustaining the established level of the power supply 34 and the power delivered to the substrate, the bias voltage level of substrate 26 automatically increases, since the power delivered to substrate surface 17 is roughly the product of the bias voltage and the ion current at the surface 27. In accordance with the principles of the present invention, the second, lower power level for the inductive coil power supply is determined such that the bias voltage level of the substrated is raised to a level no higher than 300 Volts of RF bias.

Generally, an RF bias of substrate 26 greater than 300 Volts will produce an etch which is too aggressive for the desired soft etch application of the invention. That is, the greater the bias of substrate 26, the greater the attraction of the plasma ions to surface 27 and the more aggressive the etch of surface 27.

Upon determining the first power level and second, lower power level for the inductive coil power supply, an etching power is then selected for the inductive coil power supply. The etching power level is selected approximately in the range of the determined first and second power levels, but closer to the second, lower power level than the first power level. The lower power level produces a lower amount of oxygen reflux or evolution from the chamber wall 17, and thus will allow a series of substrates to be etched without a significant reduction in the etch rate from one etch to the next. However, the etching power level should not be too low, so as to avoid a substrate bias level significantly higher than approximately 300 Volts. Similarly, the etching power level should not be too high in order to avoid a reduction in the plasma etch rate due to the increase in active oxygen in the plasma. The etching power level is also selected to establish a substrate bias level which is suitable to provide the desired etch rate. A substrate bias level which is too low will reduce the etch rate below a suitable range. To that end, in accordance with one aspect of the present invention, the etching power level is selected within the range of the first and second power levels in order to establish a suitable etch rate for the substrate, with a substrate having a semiconductor oxide layer to be etched, such as $SiO_2$, the etching power level is selected to achieve an etch rate in the range of approximately 300–500 Å/min. At that rate, a soft etch is achieved which is not significantly reduced by the amount of activated oxygen in the plasma nor an exceedingly low bias voltage at the substrate. With substrates having metal oxide layers to etch, such as $Al_2O_3$, the etching power level is selected to achieve an etch rate in the range of approximately 75–125 Å/min. In one embodiment of the invention, a power level for the substrate power supply is in the range of approximately 200–800 Watts. Further, the first and second power levels will depend upon the processing system, and such factors as the size of the process space. Generally, larger process spaces will require higher coil power to the inductive coil for a certain plasma density due to the larger physical space occupied by the plasma.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A method of sputter etching a substrate comprising:
    positioning a first substrate to be processed within a processing chamber, the first substrate including a material layer containing oxygen;
    introducing a process gas into the chamber;
    inductively coupling electrical energy to the process gas in the chamber to thereby form an ionized gas plasma in the chamber;
    positioning a second material substrate proximate the first substrate in the processing chamber;
    biasing the first and second substrates with RF electrical energy so that the plasma etches the first substrate material layer and the second substrate, the material etched from the first substrate material layer producing activated oxygen in the gas plasma;
    the second substrate being formed of a material which reacts with activated oxygen to form a stable oxygen-containing compound such that material etched from the second substrate reduces activated oxygen in the gas plasma;
    whereby residual oxygen in the processing chamber is reduced to maintain an etch rate for subsequent sputter etching processes.

2. The method of claim 1 wherein the second substrate is configured to surround a peripheral edge of the first substrate.

3. The method of claim 1 wherein the second substrate is configured in the form of a ring to surround a peripheral edge of the first substrate.

4. The method of claim 1 wherein said first and second substrates are circular in shape and have respective first and second diameters, the diameter of the second substrate being greater than the diameter of the first substrate and the second substrate being positioned beneath the first substrate in the processing chamber to form a ring of second substrate material around the peripheral edge of the first substrate.

5. The method of claim 1 wherein said first substrate material layer includes an oxide.

6. The method of claim 5 wherein said first substrate material layer includes an oxide of silicon.

7. The method of claim 5 wherein said first substrate material layer includes an oxide of aluminum.

8. The method of claim 1 wherein said second substrate is formed of a material including silicon.

9. The method of claim 1 wherein said second substrate is formed of a material including aluminum.

10. The method of claim 1 wherein said second substrate is formed of a material including titanium.

11. The method of claim 1 wherein said second substrate is formed of material including tantalum.

12. The method of claim 1 wherein said second substrate is formed of material including copper.

13. A method of sputter etching a substrate containing an oxide layer comprising:
    positioning a substrate within a processing chamber and introducing a process gas into the chamber;
    inductively coupling electrical energy to the process gas in the chamber with an inductive element coupled to an RF power supply to thereby form an ionized gas plasma in the chamber;
    biasing the substrate with an RF power supply to establish a bias voltage thereon, and selecting a power level for the substrate power supply;
    experimentally determining a first power level for the power supply coupled to the inductive element which would establish a bias voltage level of the substrate of approximately 100 Volts;
    experimentally determining a second, lower power level for the power supply coupled to the inductive element which would lower the density of the plasma and which would raise the voltage bias level of the substrate to a level not significantly higher than 300 Volts;
    establishing and maintaining an etching power level for the inductive element power supply approximately in the range of the first and second power levels but closer to the second power level than the first power level, the etching power level being selected to establish an etch rate of the substrate in a range of approximately 300 to 500 angstroms per minute.

14. The method of claim 13 further comprising inductively coupling electrical energy to the process gas with an inductive coil wound around a portion of the chamber, the inductive coil being biased with the RF power supply.

15. The method of claim 13 further comprising establishing and maintaining a power level for the substrate power supply in the range of approximately 200 to 800 Watts.

16. The method of claim 13 further comprising establishing and maintaining a first power level for the inductive coil in the range of approximately 1000 to 3000 Watts.

17. The method of claim 13 further comprising establishing and maintaining a second power level for the inductive coil in the range of approximately 1000 to 3000 Watts.

18. The method of claim 13 further comprising adjusting the power level for the substrate power supply after an etching power level has been established in order to vary the etch rate.

19. The method of claim 13 wherein said processing chamber is formed of a dielectric.

20. The method of claim 13 further comprising positioning a substrate containing silicon in the processing chamber.

21. A method of sputter etching a substrate containing an oxide layer comprising:
  positioning a substrate within a processing chamber and introducing a process gas into the chamber;
  inductively coupling electrical energy to the process gas in the chamber with an inductive element coupled to an RF power supply to thereby form an ionized gas plasma in the chamber;
  biasing the substrate with an RF power supply to establish a bias voltage thereon, and selecting a power level for the substrate power supply;
  experimentally determining a first power level for the power supply coupled to the inductive element which would establish a bias voltage level of the substrate of approximately 100 Volts;
  experimentally determining a second, lower power level for the power supply coupled to the inductive element which would lower the density of the plasma and which would raise the voltage bias level of the substrate to a level not significantly higher than 300 Volts;
  establishing and maintaining an etching power level for the inductive element power supply approximately in the range of the first and second power levels but closer to the second power level than the first power level, the etching power level being selected to establish an etch rate of the substrate in a range of approximately 75 to 125 Å/min.

22. The method of claim 21 further comprising positioning a substrate containing a metal oxide layer in the processing chamber.

23. A system for sputter etching a substrate having a material layer thereon containing oxygen, the system comprising:
  a process chamber having a substrate support therein for supporting a first substrate to be etched;
  a process gas supply for delivering a process gas into the chamber and an energy source for exciting the process gas into a plasma;
  a second substrate positioned in the chamber proximate the first substrate;
  a source of RF electrical energy operably coupled for biasing the first and second substrates so that the plasma etches material from the first and second substrates;
  the material etched from the first substrate producing activated oxygen in the gas plasma;
  the second substrate being formed of a material which reacts with activated oxygen to form a stable oxygen-containing compound such that the material etched from the second substrate reduces activated oxygen in the gas plasma;
  whereby residual oxygen in the processing chamber is reduced to maintain an etch rate for subsequent sputter etching process.

24. The system of claim 23 wherein the second substrate is configured to surround a peripheral edge of the first substrate.

25. The system of claim 23 wherein the second substrate is circular in shape and has a diameter which is greater than the diameter of a circular first substrate which is to be etched, the second substrate being positioned with the substrate support for underlying the first substrate to form a ring of the second substrate material around the peripheral edge of the first substrate.

26. A system for sputter etching a substrate having a material layer thereon containing oxygen, the system comprising:
  a process chamber having a substrate support therein for supporting a substrate to be etched;
  a process gas supply for delivering a process gas into the chamber;
  an inductive energy coupling system including an inductive element and an RF power supply coupled to the element, the inductive energy coupling system operable for inductively coupling electrical energy into the chamber for exciting the process gas into a plasma;
  a source of RF electrical energy operably coupled for biasing the substrate so that the plasma etches material from the substrate;
  the inductive energy coupling system operable for:
  determining a first power level for the RF power supply coupled to the inductive element which establishes a bias voltage level of the substrate of approximately 100 Volts; and
  determining a second, lower power level for the RF power supply coupled to the inductive element which changes the density of the plasma and which establishes a bias voltage level of the substrate of not significantly higher than approximately 300 Volts; and then
  establishing and maintaining an etching power level for the RF power supply coupled to the inductive element in the range of the first and second power levels but closer to the second power level and which establishes an etch rate of the substrate in a range of approximately 300 to 500 angstroms per minute.

27. The system of claim 26 wherein the RF power supply coupled to the inductive element operates in the range of 1000 to 3000 Watts.

* * * * *

UNITED STATES PATENT AND TRADEMARK OFFICE
CERTIFICATE OF CORRECTION

PATENT NO. : 6,143,144
DATED : November 7, 2000
INVENTOR(S) : Golovato et al.

It is certified that error appears in the above-identified patent and that said Letters Patent is hereby corrected as shown below:

Column 8,
Line 47, reads "2000 Wafts" and should read -- 2000 Watts --.

Column 10,
Line 43, reads "In another embodiment of the invention, FIG 1 is a" and should read -- FIG. 1 is a --.

Column 16,
Line 16, reads "for subsequent sputter etching process" and should read -- for subsequent sputter etching processes --.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*